United States Patent [19]

Fujimura

[11] Patent Number: 4,718,976

[45] Date of Patent: Jan. 12, 1988

[54] PROCESS AND APPARATUS FOR PLASMA TREATMENT

[75] Inventor: Shuzo Fujimura, Narashino, Japan

[73] Assignee: Fujitsu Limited, Kawasaki, Japan

[21] Appl. No.: 898,845

[22] Filed: Aug. 19, 1986

Related U.S. Application Data

[63] Continuation of Ser. No. 767,709, Aug. 22, 1985, abandoned, which is a continuation of Ser. No. 687,052, Oct. 3, 1984, abandoned, which is a continuation of Ser. No. 478,703, Mar., 1983, abandoned.

[30] Foreign Application Priority Data

Mar. 31, 1982 [JP] Japan .................. 57-52992

[51] Int. Cl.⁴ .................. C23C 14/22; C23C 14/00; C23F 1/00; C23F 1/08
[52] U.S. Cl. .................. 156/643; 156/345; 156/646; 204/192.32; 204/298; 239/390; 239/515
[58] Field of Search .................. 156/643, 345, 646; 204/182.32, 298; 239/390, 515

[56] References Cited

U.S. PATENT DOCUMENTS

| 458,762 | 9/1891 | Charonnet | 239/390 |
|---|---|---|---|
| 545,656 | 9/1895 | Lewis | 239/390 |
| 693,496 | 2/1902 | Childers | 239/515 |
| 2,077,725 | 4/1937 | Tyler | 239/515 |
| 4,264,393 | 4/1981 | Gorin et al. | 156/345 |
| 4,270,999 | 6/1981 | Hassan et al. | 156/643 |
| 4,316,791 | 2/1982 | Taillet | 204/192 E |
| 4,367,114 | 1/1983 | Steinberg et al. | 156/643 |

FOREIGN PATENT DOCUMENTS

| 166927 | 12/1980 | Japan | 156/345 |
|---|---|---|---|
| 0048226 | 3/1982 | Japan | 156/345 |
| 12735 | 1/1985 | Japan | 156/345 |
| 39832 | 3/1985 | Japan . | |
| 53-14472 | 5/1985 | Japan . | |
| 2076587 | 12/1981 | United Kingdom . | |

OTHER PUBLICATIONS

Vossen et al., Ed., Thin Film Processes Academic Press New York, N.Y. (1978) pp. 533–534.

Nordine et al., "Heterogeneous . . . Construction" AiAA Journal, vol. 14, No. 5, (1976) pp. 644–647.

Dzioba et al., "Decapsulation . . . Plasmas", J. of Electrochem Soc: Solid-State Sci and Tech., vol. 129, No. 11 (11/82) pp. 2537–2541.

Flamm et al., "XeF$_2$ . . . Etching" Solid State Technologies (4183) pp. 117–121.

Patent Abstracts of Japan, vol. 3, No. 123(C-61), Oct. 16, 1979.

*Primary Examiner*—Jerome Massie
*Attorney, Agent, or Firm*—Staas & Halsey

[57] ABSTRACT

A process and apparatus for plasma treatment by the use of a plasma generating chamber and a separate treating chamber in which an activated gas, excited in the plasma generating chamber, is introduced into the treating chamber, distributed within the treating chamber by a gas diffusing plate, and then is brought into contact with a material to be treated.

16 Claims, 6 Drawing Figures

PROCESS AND APPARATUS FOR PLASMA TREATMENT

This is a continuation of co-pending application Ser. No. 767,709 filed on Aug. 22, 1985 now abandoned, which is a continuation of U.S. Application Ser. No. 657,052, filed Oct. 3, 1984, now abandoned, which is a continuation of U.S. Application Ser. No. 478,703, filed Mar. 25, 1983, now abandoned.

BACKGROUND OF THE INVENTION

1. Field of the Invention

The invention relates to a process and apparatus for plasma treatment. More particularly, the invention relates to an improved process and apparatus for plasma treatment in which the plasma generation and the treatment are effected in separate chambers.

2. Description of the Prior Art

Processes for the production of semiconductor devices include many steps in which gas treatment is carried out. In gas treatment steps for, in particular, dry etching, chemical vapor deposition (CVD), and the like, uniformity of treatment is the most important factor. The uniformity of treatment in these gas treatment steps is highly affected by conditions of the treating gas flow formed in the treating region.

For the selective etching of semiconductor layers, insulator films, interconnection layers, and the like, there has been employed, for example, a plasma etching apparatus including a separate plasma generating chamber and a treating chamber, such as is schematically shown in FIG. 1 (see, e.g., Japanese Examined Patent Publication (Kokoku) No. 53-14472). In FIG. 1, 1 denotes a microwave generator, 2 a plasma generating chamber, 3 an etching gas feeding pipe, 4 a gas passageway, 5 a gas inlet, 6 a treating chamber, 7 an evacuation opening, 8 a material to be treated, 9 arrows indicating the direction of the gas flow, and P plasma.

In an apparatus having such a construction, at etching gas is converted into activated particles in the plasma generating chamber 2, and the activated particles are blown into the treating chamber 6 directly from the gas inlet 5. The activated particles are reacted with the material 8 in the chamber 6, and are then discharged. The etch rate of the material 8 to be treated depends on the accession percentage of the activated particles to the surface of the material to be treated and on the proportion of the elimination of the reaction product. Thus, the etch rate is highly affected by the positions of the gas inlet 5, evacuation openings 7, and the like. Thus, when a polycrystalline silicon layer of a thickness of about 4,000 Å, formed on a substrate of a diameter of 5 in., is etched on an apparatus of the above-mentioned construction, using a carbon tetrafluoride ($CF_4$)/oxygen ($O_2$) mixture having a usual composition as the etching gas, at a gas pressure of about 0.3 torr., a 10% to 20% variation of the etch rate occurs in the surface area, and the width of the formed pattern varies by 0.15 $\mu$m or more.

The above-mentioned variation in etch rate may be improved by further reducing the gas pressure in the treating chamber. However, in this case, the reduction of the gas pressure for the purpose of lowering the etch rate extensively may result in the problem of a notable reduction in the amount of the activated particles.

There has also been employed an apparatus of a construction, as shown in FIG. 2, wherein a plasma generating chamber 2 and a treating chamber 6 are separated by a plasma regulating panel 11 having punched holes (see, e.g., Japanese Unexamined Patent Publication (Kokai) No. 57-48226). In this apparatus, an etching gas introduced from an etching gas feeding pipe 3 into the plasma generating chamber 2, is converted into activated particles by irradiating the etching gas with microwaves from a microwave generator 1 through a waveguide 12 and a microwave transmitting window 13, thereby generating plasma P. The activated particles are then introduced into the treating chamber 6 which has been evacuated through evacuation openings 7 by the pressure difference, from a plurality of gas introducing holes 14 formed in the plasma regulating panel 11, and act to etch a material 8 to be treated.

In an apparatus having such a construction, however, the variation of etch rate cannot be reduced even if the gas introducing holes are changed in number, size, or shape. The arrangement of the holes in the panel 11 and the direction of the gas flow being discharged may also cause variation in the etch rate, particularly when a few holes having a small diameter are provided. For example, when a polycrystalline silicon layer of a thickness of about 4,000 Å, formed on a substrate of a diameter of 5 in., is etched using a mixed carbon tetrafluoride ($CF_4$)/oxygen/$O_2$ gas as the etching gas at a gas pressure of 1.0 to 2.0 torr., the width of the formed pattern inevitably varies more than 0.3 $\mu$m. Furthermore, it is difficult to alter the construction of the plasma regulating panel so as to obtain the best uniformity of the etching, even when the etching conditions such as the composition of the etching gas and the gas discharging rate are varied.

SUMMARY OF THE INVENTION

It is the primary object of the present invention to provide a process for plasma treatment having a small variation in treatment rate, and an apparatus for carrying out the process.

It is another object of the present invention to provide a process and apparatus in which plasma treatment having a small treatment rate variation, can be effected with a simple measure against the change of the treatment conditions.

Thus, the present invention provides a process for plasma treatment by the use of a separately provided plasma generating chamber and a treating chamber, which comprises introducing an activated gas excited in the plasma generating chamber into the treating chamber from an activated gas opening, distributing the activated gas within the treating chamber by means of a gas diffusing means provided in front of the activated gas opening, and bringing the activated gas into contact with the surface of a material to be treated downstream of the gas diffusing means within the treating chamber.

The present invention further provides an apparatus for plasma treatment having a plasma generating chamber and a separate treating chamber, usable for the practice of the above-mentioned process, which comprises a gas passageway connecting the plasma generating chamber to the treating chamber and having an opening for introducing an activated gas excited in the plasma generating chamber into the treating chamber, and a gas diffusing means provided in front of the opening of the gas passageway and upstream of the treating region within the treating chamber.

In the present invention, the introduction of the activated gas into the treating chamber may preferably be controlled by means of a conductance regulating means provided at the activated gas opening.

DESCRIPTION OF THE PREFERRED EMBODIMENTS

Figure 1:
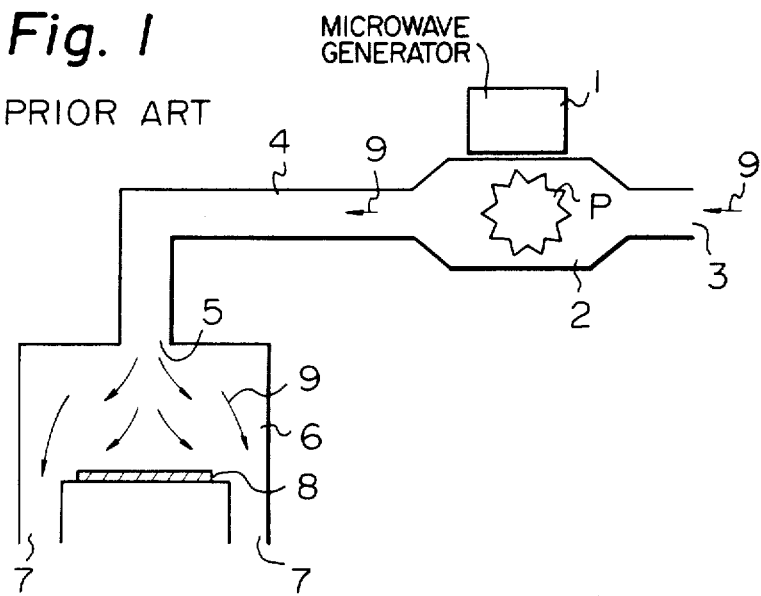
FIGS. 1 and 2 are cross-sectional views of a conventional plasma etching apparatus.
Figure 2:
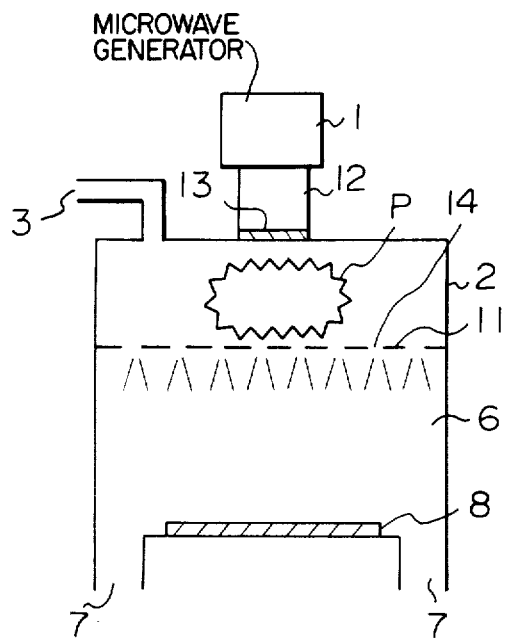
Figure 3A:
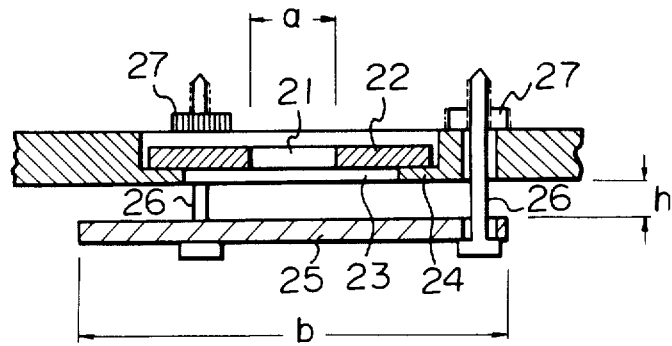
FIG. 3A is a cross-sectional view of a gas distribution controlling means comprising a conductance regulating means and a gas diffusing means, usable for the present invention.
Figure 3B:
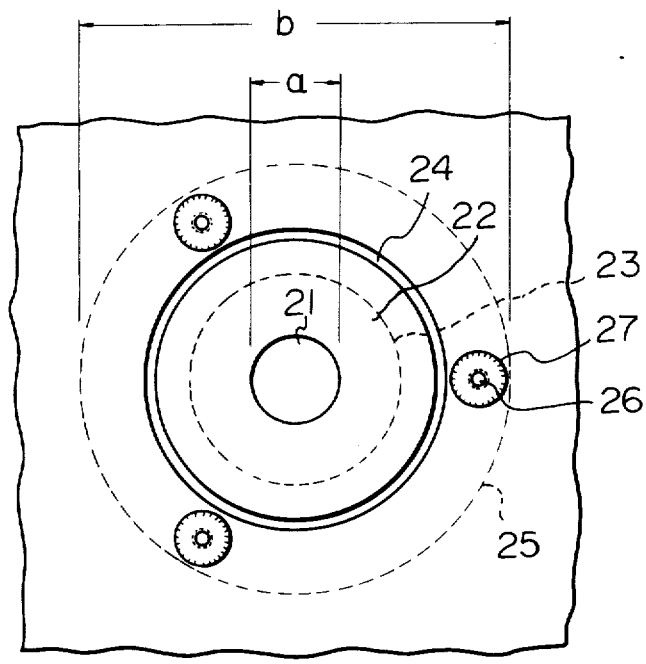
FIG. 3B is a plan view of the gas distribution controlling means shown in FIG. 3A.

In the present invention, the gas diffusing means may preferably be employed in combination with a conductance regulating means to form a gas distribution controlling means, as shown in FIGS. 3A and 3B.

Referring to FIGS. 3A and 3B, the conductance regulating means is comprised of a conductance regulating plate 22 in the form of a disc, having a circular opening 21, and a supporting mechanism 24 for supporting the conductance regulating plate 22, provided at the periphery of a circular opening 23 for introducing the activated gas into the treating chamber. The introduction of the gas is regulated, for example, by changing regulating plates 22 with openings 21 of different diameters a. Alternatively, the diameter of the opening 21 may be changed by means of a shutter mechanism. The main purpose of the conductance regulating plate 22 is to keep the rate of introduction of the activated gas into the treating chamber within a proper range in conformity with the change of the composition of the gas, the shape of the gas passageway, and other treatment conditions. Thus, the conductance regulating plate need not be provided if no change of the treatment conditions is required.

The gas diffusing means, which constitutes the most important feature of the present invention, may comprise, for example, a circular gas diffusing plate 25 having a diameter b, fixed in front of the activated gas opening 23 by means of three pairs of bolts 26 and nuts 27, at a predetermined distance h from the open surface of the activated gas opening 23. The diffusion of the activated gas may effectively be controlled by exchanging gas diffusing plates 25 with different diameters and by altering the distance h between the gas diffusing plate 25 and the open surface of the activated gas opening 23 or the angle of the gas diffusing plate 25 with respect to the axis of the activated gas opening 23. The distance h and the angle may be altered by adjusting the bolts 26 and the nuts 27. The gas diffusing plate 25 is located at a position opposed to the activated gas opening 23 in the treating chamber and acts to diffuse the activated gas once the activated gas strikes the plate 25. The optimum size, shape and position of the plate 25 may largely depend on the shape of the inside of the treating chamber.

Figure 4:
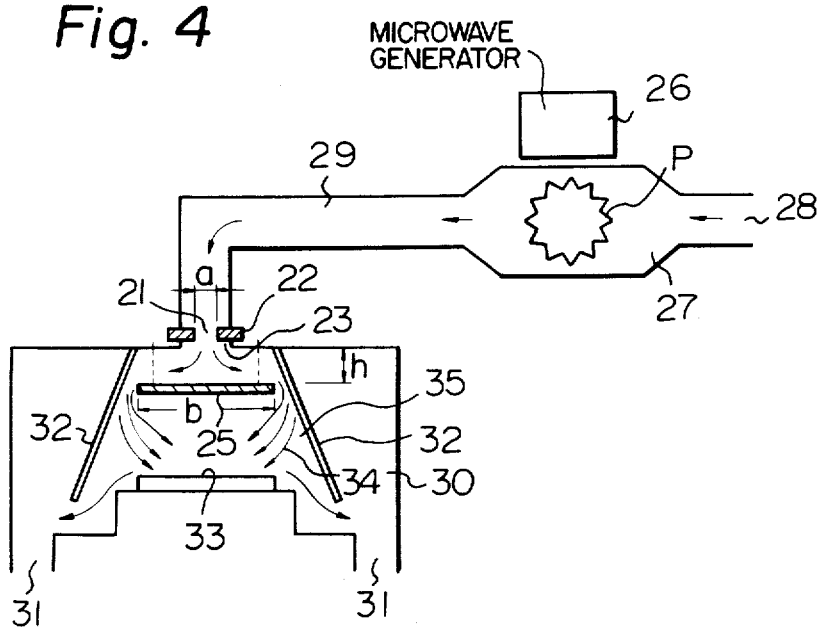
FIGS. 4 and 5 are cross-sectional views of an embodiment of the plasma treating apparatus according to the present invention.
Figure 5:
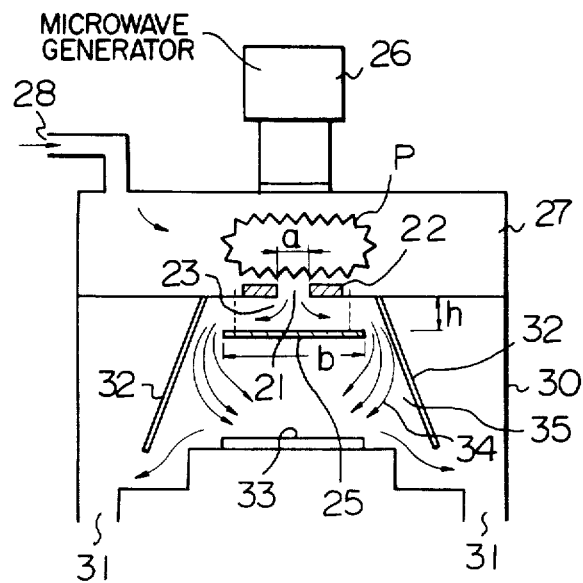

FIGS. 4 and 5 are schematic diagrams of embodiments of the plasma treatment apparatus according to the present invention, including the above-mentioned gas distribution controlling means. In these figures, 21 denotes an opening of a conductance regulating plate, 22 the conductance regulating plate, 23 an activated gas opening provided in the upper portion of a treating chamber, 25 a gas diffusing plate, 26 a microwave generator, 27 a plasma generating chamber, 28 a treating gas feeding pipe, 29 a gas passageway, 30 the treating chamber, 31 an evacuation opening, 32 a barrier, 33 a material to be treated, 34 an arrow indicating the direction of the gas flow, P plasma, a the diameter of the opening 21 of the conductance regulating plate 22, b the diameter of the gas diffusing plate 25, and h the distance between the gas diffusing plate 25 and the activated gas opening 23.

In these apparatuses, the frustrum barrier 32 is provided so as to cover the material 33 to be treated and to define a limited treating region 35. The confinement of the treating region 35 to a limited space is advantageous in the case where the treating chamber 30 has a large plane area. Thus, in the case where the plane area of the treating chamber 30 is about 4 to 5 times (or less) the area of the treating surface, it may not be necessary to provide such a barrier.

The above-mentioned conductance regulating plate 22, gas diffusing plate 25, and barrier 32 may advantageously be made of a material, e.g., aluminum, which is highly resistant to a treating gas such as an etching gas.

The present invention will further be illustrated below with reference to an etching example which was carried out using one of the apparatuses mentioned above.

In the apparatus employed, the upper diameter of the frustrum barrier 32 was 130 mm, the lower diameter thereof was 160 mm, and the height thereof, i.e., the distance between the ceiling of the treating chamber 30 and the lower periphery of the barrier 32, was 80 mm. The distance between the ceiling of the treating chamber 30 and the surface of the material 33 to be treated was 70 mm. The diameter a of the opening 21 of the conductance regulating plate 22 was adjusted to 12.5 mm, so that the inner pressure of the plasma generating chamber was well maintained and the activated species existed in a satisfactory amount. A mixed gas consisting of $CF_4$ and $O_2$ was fed as the etching gas at a rate of 400 cc/min of $CF_4$ and 120 cc/min of $O_2$, and then activated by irradiating it with microwaves at a frequency of 2.45 GHz and 1 kW power to form activated species. The gas pressure in the treating chamber was adjusted to 0.5 to 1 torr. The gas diffusing plate 25 was maintained parallel to the open surface of the activated gas opening 23.

A polycrystalline silicon layer formed on a material (substrate) 33 of a diameter of 5 in. was etched under the above conditions with different diameters b of the gas diffusing plate 25 and distances h between the gas diffusing plate 25 and the open surface of the activated gas opening 23. The variation of the etch rate in the etched surfaces was then evaluated.

The results are as shown in Table 1 and Table 2 below. Table 1 shows the results obtained by fixing the diameter b at 90 mm and varying the distance h, while Table 2 shows the results obtained by fixing the distance h at to 1.5 mm and varying the diameter b.

TABLE 1

| h in mm | Etch rate variation in % |
|---|---|
| 1.5 | 4 |
| 5 | 7–8 |
| 10 | >10 |

TABLE 2

| b in mm | Etch rate variation in % |
| --- | --- |
| 60 | 4 to 5 |
| 90 | 4 |
| 100 | 3.5 to 4 |

From the results, it is apparent that, in the above-mentioned etching, it is most desirable that the diameter b of the gas diffusing plate 25 be adjusted to 100 mm and the distance h between the gas diffusing plate 25 and the open surface of the activated gas opening 23 be adjusted to 1.5 mm. In this case, an etch rate variation of only about 4% can be obtained. This is a notable improvement compared with the 10% to 20% etch rate variation of the conventional etching process, as mentioned hereinbefore. It is further apparent that the variation of etch rate was improved in all cases by the use of the gas diffusing plate.

In the above-mentioned etching example, the gas pressure in the treating chamber was from 0.1 to 1 torr, which is about 2 to 3 times the gas pressure in conventional etching processes. Thus, the etch rate was about 3,500 to 4,000 Å/min, which is about 2 times the etch rate in conventional etching processes.

In the apparatus employed in the above example, the plasma etching region was defined by the barrier 32. However, similar results may be obtained without the use of a barrier if an apparatus having a treating chamber of with an inner diameter of 160 to 180 mm is employed.

Further, if the angle of the gas diffusing plate 25 to the axis of the activated gas opening 23 is changed so that the gas diffusing plate 25 is located not parallel to the open surface of the activated gas opening 23, it is possible to intentionally vary the etch rate in the treated surface.

According to the present invention, as explained above, an etch rate variation of only about 4% can be obtained in the etching of a substrate having a diameter of about 5 in. Therefore, a variation of not more than 0.1 μm can be attained in the width of the formed pattern and, thus, semiconductor devices having fine patterns, such as large scale integration devices, can be produced effectively.

Further, the present invention is, of course, useful for the etching of materials other than the polycrystalline silicon layer and is also useful for plasma CVD.

I claim:

1. A process for plasma treatment of a material in a treating chamber using a separate plasma generating chamber, comprising the steps of:
   (a) introducing an activated gas, excited in the plasma generating chamber, into the treating chamber through an activated gas opening, so that the activated gas impinges upon a gas diffusing device positioned in front of the activated gas opening perpendicular to the direction of the activated gas flow and parallel to the material in the treating chamber;
   (b) distributing the activated gas within the treating chamber using the gas diffusing device after the activated gas has impinged upon the gas diffusing device, said distributing step comprising distributing the activated gas in a limited treating region defined by a barrier positioned within the treating chamber and extending from an upper portion at either side of the plasma generating chamber adjacent the activated gas opening to a lower portion at either side of the material to be treated; and
   (c) bringing the activated gas into contact with the surface of the material to be treated downstream of the gas diffusing device within the treating chamber.

2. A process as claimed in claim 1, wherein said step (a) comprises introducing the activated gas into the treating chamber through the activated gas opening by way of a conductance regulating device.

3. A plasma treatment apparatus having a plasma generating chamber in which an activated gas is excited, and a separate treating chamber having a treating region for plasma treatment of a material, comprising:
   a gas passageway connecting the plasma generating chamber to the treating chamber and having an opening for introducing the activated gas which is excited in the plasma generating chamber, into the treating chamber;
   gas diffusing means, positioned laterally in front of the opening of the gas passageway upstream of the treating region within the treating chamber and perpendicular to the flow of the activated gas, for distributing the activated gas within the treating chamber; and
   a barrier, positioned in the treatment chamber so as to surround said gas diffusing means, extending from an upper portion located adjacent the gas passageway to a lower portion adjacent the material to be treated, for defining the treating region.

4. A plasma treatment apparatus as claimed in claim 3, wherein said gas diffusing means is variable in size, wherein the distance at which said gas diffusing means is positioned from the activated gas opening is variable, and wherein the angle to which said gas diffusing means is positioned with respect to the axis of the activated gas opening is variable.

5. A plasma treatment apparatus as claimed in claim 3, further comprising conductance regulating means, positioned at the activated gas opening, for introducing the activated gas into the treating chamber.

6. A plasma treatment apparatus as claimed in claim 5, wherein said conductance regulating means has an opening which is variable in size.

7. A plasma treatment apparatus having a plasma generating chamber for exciting activated gas and having a separate treating chamber for plasma treatment of a material, comprising:
   a gas passageway connecting the plasma generating chamber to the treating chamber and having an opening for introducing the activated gas which is excited in the plasma generating chamber, into the treating chamber;
   a gas diffusing plate, positioned laterally in front of the opening of the gas passageway between the opening of the gas passageway and the material to be treated and perpendicular to the direction of flow of the activated gas, for distributing the activated gas within the treating chamber; and
   a barrier, positioned in the treatment chamber so as to surround said gas diffusing plate, having an upper portion extending from the plasma generating portion to a lower portion adjacent the material to be treated, for defining a treating region.

8. A plasma treatment apparatus as claimed in claim 7, further comprising a conductance regulating plate having an aperture for defining the activated gas opening through which the activated gas is introduced into the treating chamber.

9. A plasma treatment apparatus as claimed in claim 8, further comprising means for varying the distance between said gas diffusing plate and said conductance regulating plate.

10. A plasma treatment apparatus as claimed in claim 9, further comprising means for varying the angle at which said gas diffusing plate is positioned with respect to the axis of the aperture in said conductance regulating plate.

11. A plasma treatment apparatus as claimed in claim 10, wherein said gas diffusing plate has a variable diameter.

12. A plasma treatment apparatus as claimed in claim 11, wherein the aperture of said condutance regulating plate has a variable diameter.

13. A plasma treatment apparatus as claimed in claim 8, further comprising means for varying the angle at which said gas diffusing plate is positioned with respect to the axis of the aperture in said conductance regulating plate.

14. A plasma treatment apparatus as claimed in claim 7, wherein said gas diffusing plate has a variable diameter.

15. A plasma treatment apparatus as claimed in claim 8, wherein the aperture of said conductance regulating plate has a variable diameter.

16. A plasma treatment apparatus as claimed in claim 8, further comprising a barrier, positioned in the treatment chamber so as to surround said gas diffusing plate, for defining a treating region.

* * * * *

UNITED STATES PATENT AND TRADEMARK OFFICE
CERTIFICATE OF CORRECTION

PATENT NO. : 4,718,976
DATED : January 12, 1988
INVENTOR(S) : Shuzo FUJIMURA

It is certified that error appears in the above-identified patent and that said Letters Patent is hereby corrected as shown below:

Front Page [63], line 2, change "687,052" to --657,052--.

Column 1, line 31, delete "separate";
         line 32, after "a" insert --separate--.

Column 3, line 53, after "23" insert --,--.

Column 4, line 61, delete "to".

Column 5, line 10, change "b" to -- $\underline{b}$ --;
         line 11, change "h" to -- $\underline{h}$ --;
         line 30, delete "of" (first occurrence).

Signed and Sealed this

Twenty-eighth Day of June, 1988

*Attest:*

DONALD J. QUIGG

*Attesting Officer*        *Commissioner of Patents and Trademarks*